United States Patent
Zeng et al.

(10) Patent No.: US 9,633,591 B2
(45) Date of Patent: Apr. 25, 2017

(54) DIGITAL-TO-ANALOG CONVERTER, PROGRAMMABLE GAMMA CORRECTION BUFFER CIRCUIT AND DISPLAY APPARATUS

(71) Applicant: Shenzhen China Star Optoelectronics Technology Co., Ltd., Shenzhen, Guangdong (CN)

(72) Inventors: Dekang Zeng, Guangdong (CN); Dongsheng Guo, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 321 days.

(21) Appl. No.: 14/386,302

(22) PCT Filed: Aug. 7, 2014

(86) PCT No.: PCT/CN2014/083926
§ 371 (c)(1),
(2) Date: Sep. 18, 2014

(87) PCT Pub. No.: WO2016/011678
PCT Pub. Date: Jan. 28, 2016

(65) Prior Publication Data
US 2016/0253939 A1      Sep. 1, 2016

(30) Foreign Application Priority Data

Jul. 25, 2014   (CN) .......................... 2014 1 0362433

(51) Int. Cl.
*G09G 3/20*     (2006.01)
*G09G 3/32*     (2016.01)
(Continued)

(52) U.S. Cl.
CPC ......... *G09G 3/2003* (2013.01); *G09G 3/3225* (2013.01); *G09G 3/3266* (2013.01);
(Continued)

(58) Field of Classification Search
CPC ......... G09G 3/3685; G09G 2310/0259; G09G 2310/0291; G09G 2330/028;
(Continued)

(56) References Cited

U.S. PATENT DOCUMENTS

| | | | |
|---|---|---|---|
| 2002/0126083 A1* | 9/2002 | Cairns | G09G 3/20 345/98 |
| 2008/0030489 A1* | 2/2008 | Kim | G09G 3/3688 345/205 |
| 2010/0321361 A1* | 12/2010 | Weng | G09G 3/3607 345/211 |

FOREIGN PATENT DOCUMENTS

CN      102281073 A    12/2011

* cited by examiner

*Primary Examiner* — Ariel Balaoing
(74) *Attorney, Agent, or Firm* — Andrew C. Leng

(57) ABSTRACT

A digital-to-analog converter is for outputting a first output analog voltage according to a N-bit first digital signal or outputting a second output analog voltage according to a N-bit second digital signal and includes: a first voltage generator coupled between first and second reference voltages and for generating $2^N$ first analog voltage between the first and second reference voltages, a first voltage selector for selecting the first output analog voltage from the $2^N$ first analog voltage according to the N-bit first digital signal, a second voltage generator coupled to second and third reference voltages and for generating $2^N$ second analog voltages between the second and third reference voltages, a second voltage selector for selecting the second output analog voltage from the $2^N$ second analog voltages according to the N-bit second digital signal. A programmable
(Continued)

gamma correction buffer circuit and a display apparatus also are provided.

20 Claims, 3 Drawing Sheets

(51) Int. Cl.
*G09G 3/36* (2006.01)
*H03M 1/66* (2006.01)
*G09G 3/3225* (2016.01)
*G09G 3/3266* (2016.01)
*G09G 3/3275* (2016.01)
*H03M 1/80* (2006.01)

(52) U.S. Cl.
CPC ......... *G09G 3/3275* (2013.01); *G09G 3/3677* (2013.01); *G09G 3/3685* (2013.01); *G09G 3/3688* (2013.01); *H03M 1/66* (2013.01); *G09G 2310/027* (2013.01); *G09G 2310/0259* (2013.01); *G09G 2310/0291* (2013.01); *G09G 2320/0276* (2013.01); *G09G 2330/028* (2013.01); *H03M 1/808* (2013.01)

(58) Field of Classification Search
CPC ..... G09G 2310/027; G09G 2320/0276; G09G 3/3677; G09G 3/3275; G09G 3/3266
See application file for complete search history.

DIGITAL-TO-ANALOG CONVERTER, PROGRAMMABLE GAMMA CORRECTION BUFFER CIRCUIT AND DISPLAY APPARATUS

TECHNICAL FIELD

The present invention relates to a digital-to-analog converter, a programmable gamma correction buffer circuit and a display apparatus.

DESCRIPTION OF RELATED ART

In liquid crystal display (LCD) apparatuses, most of which are equipped with a gamma correction circuit to generate gamma correction voltages for performing gamma correction of images. A source driving circuit would generate desired driving signals of the liquid crystal display apparatus according to the gamma correction voltages to thereby make the liquid crystal display apparatus exhibit a desired brightness.

The gamma correction circuit generally includes a digital-to-analog converter (DAC) for converting an inputted digital signal to an analog signal. Currently, there are various different digital-to-analog converters in the market, such as resistor string (R-String) digital-to-analog converters. FIG. 1 is a conventional 3-bit resistor ring digital-to-analog converter. As illustrated in FIG. 1, the 3-bit resistor ring digital-to-analog converter 100 includes a string of resistors 110 and a selector 120. The selector 120 includes select lines 121 and control lines 122 arranged crossing over the select lines 121. Each two control lines 122 are controlled by one bit of an inputted digital signal, and one of the two control lines 122 is electrically connected to a NOT gate 123. Each select line 121 includes switching elements 124. Each switching element 123 is arranged at an intersection of one select line 121 and one of the two control lines 122. Each switching element 124 for example is a NMOS transistor. Each switching element 124 is controlled by one bit of the digital signal.

The resistor string is electrically connected between a high reference voltage $V_H$ and a low reference voltage $V_L$. Each select line 121 is electrically connected to a corresponding one node of the resistor string. At the same time, all switching elements 124 of only one select line 121 are switched on by the inputted digital signal and thereby a voltage at a corresponding node in the resistor string is coupled to an output node Vo.

The resistor string digital-to-analog converter 100 needs $2^3=8$ select lines 121. Moreover, each select line 121 needs 3 switching elements 124, and therefore the 3-bit resistor string digital-to-analog converter 100 needs $2^3 \times 3=24$ switching elements 124.

It can be seen that, for an N-bit resistor string digital-to-analog converter, $2^N$ select lines are needed. Moreover, each select line needs N switching elements. Therefore, the N-bit resistor string digital-to-analog converter needs ($2^N \times N$) switching elements. It can be found that, when the number of bits of the inputted digital signal is increased, the number of the switching elements would be sharply increased, resulting in the layout area being expanded, which is disadvantageous to the miniaturization of chip and the reduction of cost.

SUMMARY

In order to solve the problem in the prior art, an objective of the present invention is to provide a digital-to-analog converter for outputting a first output analog voltage according to a N-bit first digital signal or outputting a second output analog voltage according to a N-bit second digital signal. The digital-to-analog converter includes: a first voltage generator coupled between a first reference voltage and a second reference voltage and configured (i.e., structured and arranged) for generating $2^N$ first analog voltages between the first reference voltage and the second reference voltage; a first voltage selector coupled to the first voltage generator and configured for selecting the first output analog voltage for the $2^N$ first analog voltages generated by the first voltage generator according to the N-bit first digital signal; a second voltage generator coupled between the second reference voltage and a third reference voltage and configured for generating $2^N$ second analog voltages between the second reference voltage and the third reference voltage; and a second voltage selector coupled to the second voltage generator and configured for selecting the second output analog voltage from the $2^N$ second analog voltages generated by the second voltage generator according to the N-bit second digital signal.

In an exemplary embodiment, the digital-to-analog converter further includes: a first voltage follower configured for outputting the first output analog voltage selected by the first voltage selector according to the N-bit first digital signal.

In an exemplary embodiment, the first voltage generator includes ($2^N-1$) first resistors and at least one second resistor connected together in series.

In an exemplary embodiment, the first voltage selector includes $2^N$ first select lines, each first select line is correspondingly coupled to the first voltage generator to thereby provide a first output analog voltage corresponding to the first select line, each first select line includes N first switching elements connected in series, each first switching element is controlled to be ON or OFF state by one bit of the N-bit first digital signal.

In an exemplary embodiment, the digital-to-analog converter includes: a second voltage follower configured for outputting the second output analog voltage selected by the second voltage selector according to the N-bit second digital signal.

In an exemplary embodiment, the second voltage generator includes ($2^N-1$) third resistors and at least one fourth resistor connected together in series.

In an exemplary embodiment, the second voltage selector includes $2^N$ second select lines, each second select line is correspondingly coupled to the second voltage generator to thereby provide a second output analog voltage corresponding to the second select line, each second select line includes N second switching elements connected in series, each second switching element is controlled to be ON or OFF state by one bit of the second digital signal.

Another objective of the present invention is to provide a programmable gamma correction buffer circuit. The programmable gamma correction buffer circuit includes: a digital signal receiver configured for receiving a digital signal and providing the received digital signal to a digital-to-analog converter; and the above-described digital-to-analog converter configured for converting the digital signal provided by the digital signal receiver into a corresponding analog voltage.

Still another objective of the present invention is to provide a display apparatus. The display apparatus includes: the above-described programmable gamma correction buffer circuit configured for converting an inputted digital signal into a corresponding analog voltage; a data driver configured for generating a driving voltage desired by a display panel according to the analog voltage provided by the programmable gamma correction buffer circuit; a scan driver configured for sequentially generating scanning signals; and the display panel configured for displaying an image in response to the driving voltage provided by the data driver and the scanning signals provided by the scan driver.

In an exemplary embodiment, the display panel is a liquid crystal display panel or an organic light emitting diode display panel.

Sum up, the digital-to-analog converter, programmable gamma correction buffer circuit and display apparatus of the present invention can reduce the number/amount of the switching elements, the layout area can be reduced and is advantageous to minimize occupied size of chip and reduce the cost.

BRIEF DESCRIPTION OF THE DRAWINGS

The above and other aspects, features and advantages of embodiments of the present invention will be more apparent from the following detailed description taken in conjunction with the accompanying drawings, in which.

DETAILED DESCRIPTION OF EMBODIMENTS

In the following, various embodiments of the present invention will be described in detail with reference to accompanying drawings. The present invention may be embodied in many different forms and should not be construed as limiting to the embodiments set forth herein. Rather, these embodiments are provided to explain the principles of the present invention and its practical applications, so that other skilled in the art can understand various embodiments of the present invention and various modifications suitable for specific intended applications.

Figure 2:
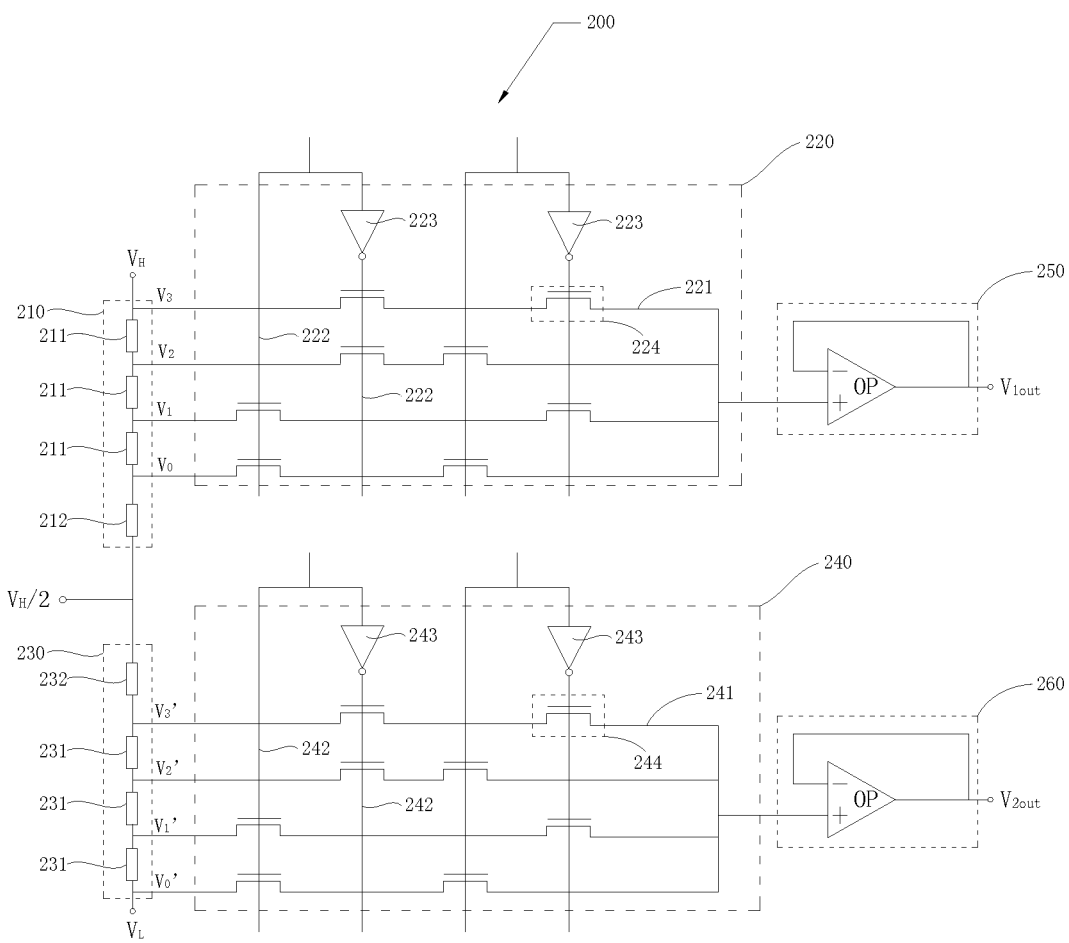
FIG. 2 is a schematic circuit diagram of a digital-to-analog converter according to an exemplary embodiment of the present invention.

FIG. 2 is a schematic circuit diagram of a digital-to-analog converter according to an exemplary embodiment of the present invention.

Figure 1:
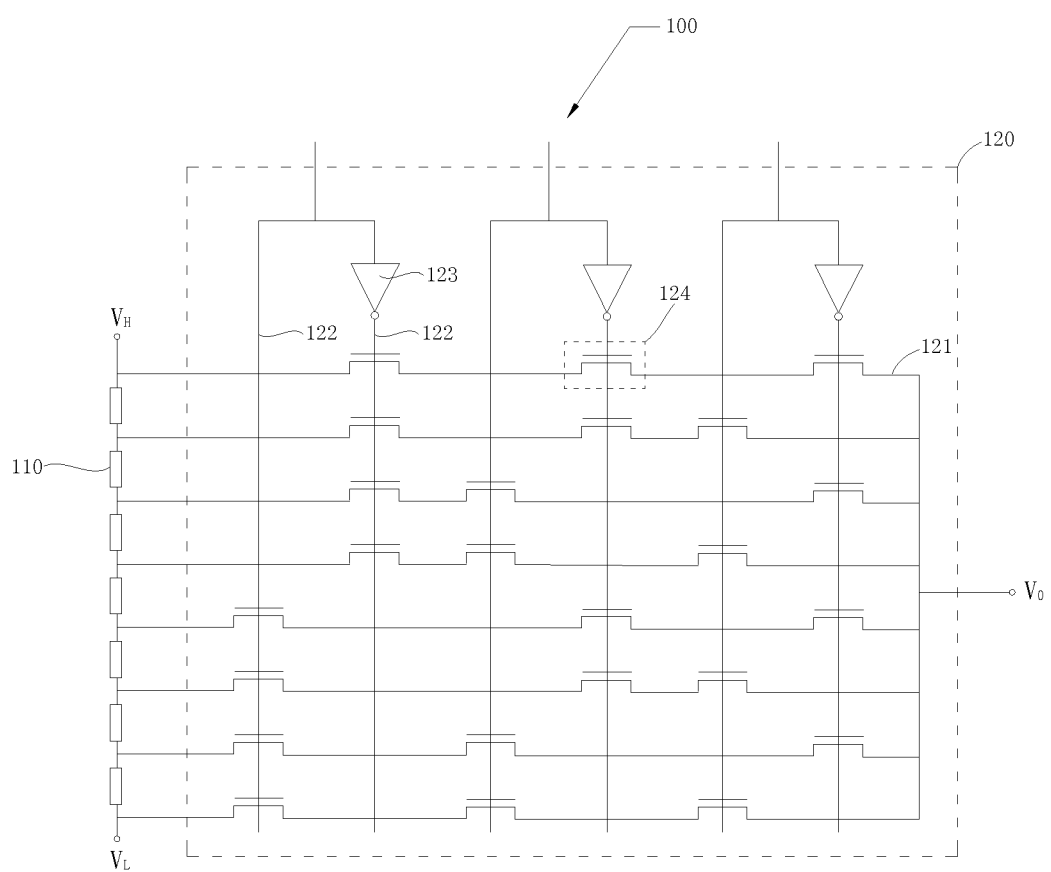
FIG. 1 is a schematic view of a conventional resistor string digital-to-analog converter.

Referring to FIG. 2, the digital-to-analog converter (DAC) 200 according to the exemplary embodiment of the present invention for example is a 2-bit digital-to-analog converter, which can realize the function of the 3-bit digital-to-analog converter 100 of FIG. 1, but the number/amount of switching elements is significantly reduced. As a result, a layout area of the digital-to-analog converter 200 according to the exemplary embodiment of the present invention is reduced, which is advantageous to minimize occupied size of chip and reduce the cost.

The digital-to-analog converter 200 according to the exemplary embodiment of the present invention may include a first voltage generator 210, a first voltage selector 220, a second voltage generator 230, and a second voltage selector 240.

The first voltage generator 210 is electrically coupled between a first reference voltage (e.g., a high reference voltage) $V_H$ and a second reference voltage (e.g., a semi-high reference voltage) $V_H/2$ to thereby output a group of (i.e., $2^2$) first analog voltages $V_0, V_1, V_2, V_3$ between the first reference voltage $V_H$ and the second reference voltage $V_H/2$. In the exemplary embodiment, the first voltage generator 210 includes 3 (i.e., $2^2-1$) first resistors 211 and one second resistor 212 electrically coupled together in series. A resistance of the second resistor 212 is a half of that of each first resistor 211. The group of first analog voltages $V_0, V_1, V_2, V_3$ are node voltages of the 3 first resistors 211 and the second resistor 212. Herein, the group of first analog voltages $V_0, V_1, V_2, V_3$ may correspond to 4 high voltages of the 8 voltages generated by the 3-bit digital-to-analog converter 100 of FIG. 1. For example, the 8 voltages generated by the 3-bit digital-to-analog converter 100 of FIG. 1 from low to high sequentially are V0, V1, V2, V3, V4, V5, V6 and V7, and the group of first analog voltages $V_0, V_1, V_2, V_3$ respectively are the 4 high voltages V4, V5, V6, V7 generated by the 3-bit digital-to-analog converter 100 of FIG. 1.

The first voltage selector 220 is electrically coupled to the first voltage generator 210 and selects a first output analog voltage form the group of first analog voltages $V_0, V_1, V_2, V_3$ according to an inputted first digital signal (e.g., a 2-bit digital signal). In the exemplary embodiment, the first voltage selector 220 includes 4 (i.e, $2^2$) first select lines 221 and 4 (i.e, $2^2$) first control lines 222 arranged crossing over the first select lines 221. Each two first control signal 222 is controlled by one bit of the first digital signal, and one of the two control signals 222 is electrically connected to a first NOT gate 223. Each first select line 221 includes 2 (i.e., $2^{2-1}$) first switching elements 224, and each first switching element 224 is arranged at an intersection of one first select line 221 and one of the two first control lines 222. In the exemplary embodiment, each first switching element 224 for example is a NMOS transistor. Each first switching element 224 is controlled by one bit of the first digital signal. The inputted first digital signal received by the first voltage selector 220 selects a corresponding first output analog voltage by controlling ON and OFF states of the first switching elements 224.

Each first select line 221 is electrically connected to a corresponding node in the first voltage generator 210. At the same time, all first switching elements of only one first select line 221 are switched on by the inputted first digital signal, and the analog voltage at a corresponding node in the first voltage generator 210 is outputted.

For example, when the bits of inputted first digital signal received by the first voltage selector 220 are 00, the first analog voltage $V_0$ (i.e., corresponding to the high voltage V4 generated by the 3-bit digital-to-analog converter 100 of FIG. 1) is selected as the first output analog voltage by the first voltage selector 220. When the bits of inputted first digital signal received by the first voltage selector 220 are 01, the first analog voltage $V_1$ (i.e., corresponding to the high voltage V5 generated by the 3-bit digital-to-analog converter 100 of FIG. 1) is selected as the first output analog voltage by the first voltage selector 220. When the bits of inputted first digital signal received by the first voltage selector 220 are 10, the first analog voltage $V_2$ (i.e., corresponding to the high voltage V6 generated by the 3-bit digital-to-analog converter 100 of FIG. 1) is selected as the first output analog voltage by the first voltage selector 220. When the bits of inputted first digital signal received by the first voltage selector 220 are 11, the first analog voltage $V_3$ (i.e., corresponding to the high voltage V7 generated by the 3-bit digital-to-analog converter 100 of FIG. 1) is selected as the first output analog voltage by the first voltage selector 220.

Furthermore, the digital-to-analog converter 200 according to the exemplary embodiment of the present invention may further include a first voltage follower 250 for outputting the corresponding first output analog voltage selected by the first voltage selector 220 according to inputted first digital signal. The first voltage follower 250 for example is an operational amplifier, but the present invention is not limited to this.

The second voltage generator 230 is electrically coupled between the second reference voltage (e.g., the semi-high reference voltage) $V_H/2$ and a third reference voltage (e.g., a low reference voltage) $V_L$ to thereby output a group of (i.e., $2^2$) second analog voltages $V_0'$, $V_1'$, $V_2'$, $V_3'$ between the second reference voltage $V_H/2$ and the third reference voltage $V_L$. In the exemplary embodiment, the second voltage generator 230 includes one fourth resistor 232 and 3 (i.e., $2^2-1$) third resistors 231 electrically coupled together in series. A resistance of each third resistor 231 is a half of that of the fourth resistor 232. The resistance of fourth resistor 232 is equal to that of each first resistor 211. The group of second analog voltages $V_0'$, $V_1'$, $V_2'$, $V_3'$ are node voltages of the fourth resistor 232 and the 3 third resistors 231. Herein, the group of second analog voltages $V_0'$, $V_1'$, $V_2'$, $V_3'$ may correspond to 4 low voltages of the 8 voltages generated by the 3-bit digital-to-analog converter 100 of FIG. 1. For example, the 8 voltages generated by the 3-bit digital-to-analog converter 100 of FIG. 1 from low to high sequentially are V0, V1, V2, V3, V4, V5, V6 and V7, and the group of second analog voltages $V_0'$, $V_1'$, $V_2'$, $V_3'$ respectively are the 4 low voltages V0, V1, V2, V3 generated by the 3-bit digital-to-analog converter 100 of FIG. 1.

The second voltage selector 240 is electrically coupled to the second voltage generator 230 and selects a second output analog voltage form the group of second analog voltages $V_0'$, $V_1'$, $V_2'$, $V_3'$ according to an inputted second digital signal (e.g., a 2-bit digital signal). In the exemplary embodiment, the second voltage selector 240 includes 4 (i.e., $2^2$) second select lines 241 and 4 (i.e., $2^2$) second control lines 242 arranged crossing over the second select lines 241. Each two second control signal 242 is controlled by one bit of the second digital signal, and one of the two second control signals 242 is electrically connected to a second NOT gate 243. Each second select line 241 includes 2 (i.e., $2^{2-1}$) second switching elements 244, and each second switching element 244 is arranged at an intersection of one second select line 241 and one of the two second control lines 242. In the exemplary embodiment, each second switching element 244 for example is a NMOS transistor. Each second switching element 244 is controlled by one bit of the second digital signal. The inputted second digital signal received by the second voltage selector 240 selects a corresponding second output analog voltage by controlling ON and OFF states of the second switching elements 244.

Each second select line 241 is electrically connected to a corresponding node in the second voltage generator 230. At the same time, all second switching elements of only one second select line 241 are switched on by the inputted second digital signal, and the analog voltage at a corresponding node in the second voltage generator 230 is outputted.

For example, when the bits of inputted second digital signal received by the second voltage selector 240 are 00, the second analog voltage $V_0'$ (i.e., corresponding to the low voltage V0 generated by the 3-bit digital-to-analog converter 100 of FIG. 1) is selected as the second output analog voltage by the second voltage selector 240. When the bits of inputted second digital signal received by the second voltage selector 230 are 01, the second analog voltage $V_1'$ (i.e., corresponding to the low voltage V1 generated by the 3-bit digital-to-analog converter 100 of FIG. 1) is selected as the second output analog voltage by the second voltage selector 230. When the bits of inputted second digital signal received by the second voltage selector 230 are 10, the second analog voltage $V_2'$ (i.e., corresponding to the low voltage V2 generated by the 3-bit digital-to-analog converter 100 of FIG. 1) is selected as the second output analog voltage by the second voltage selector 230. When the bits of inputted second digital signal received by the second voltage selector 230 are 11, the second analog voltage $V_3'$ (i.e., corresponding to the low voltage V3 generated by the 3-bit digital-to-analog converter 100 of FIG. 1) is selected as the second output analog voltage by the second voltage selector 240.

Furthermore, the digital-to-analog converter 200 according to the exemplary embodiment of the present invention may further include a second voltage follower 260 for outputting the corresponding second output analog voltage selected by the second voltage selector 240 according to inputted second digital signal. The second voltage follower 260 for example is an operational amplifier, but the present invention is not limited to this.

In addition, in the exemplary embodiment, the first digital signal and the second digital signal can be inputted simultaneously according to actual situation or inputted asynchronously (e.g., sequentially) according to actual situation, the present invention does not make a particular limit.

It can be seen from above, the 2-bit digital-to-analog converter 200 according to the exemplary embodiment of the present invention needs 8 select lines and can output 8 (i.e., $2^3$) analog voltages, and thereby can achieve the function of the 3-bit digital-to-analog converter 100 of FIG. 1. Moreover, each select line needs 2 switching elements. Therefore, the 2-bit digital-to-analog converter 200 of the exemplary embodiment of the present invention needs 16 (i.e., 8×2) switching elements. However, the conventional 3-bit digital-to-analog converter 100 of FIG. 1 needs 24 (8×3) switching elements. Accordingly, the 2-bit digital-to-analog converter 200 of the exemplary embodiment of the present invention can reduce the number of switching elements, and the layout area can be reduced, which is advantageous to minimize occupied size of chip and reduce the cost.

In addition, although the digital-to-analog converter 200 of the above exemplary embodiment of the present invention takes the 2-bit digital-to-analog converter as an example, the present invention is not limited to this. The digital-to-analog converter of the present invention may be any N-bit digital-to-analog converter, for example, the N-bit digital-to-analog converter needs $2^{N+1}$ select lines and can output $2^{N+1}$ analog voltages, and thereby achieves the function of conventional (N+1)-bit digital-to-analog converter. Moreover, each select line needs N switching elements and thus the N-bit digital-to-analog converter needs ($N\times2^{N+1}$) switching elements. However, the conventional (N+1)-bit digital-to-analog converter needs $[(N+1)\times2^{N+1}]$ switching elements, where N is a positive integer. It is can be seen that, the number of switching elements needed by the N-bit digital-to-analog converter of the present invention is farther less than the number of switching elements needed by the conventional (N+1)-bit digital-to-analog converter.

Figure 3:
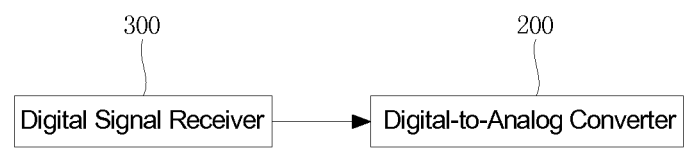
FIG. 3 is a schematic block diagram of a programmable gamma correction buffer circuit according to an exemplary embodiment of the present invention.

FIG. 3 is a schematic block diagram of a programmable gamma correction buffer circuit according to an exemplary embodiment of the present invention.

Referring to FIG. 3, the programmable gamma correction buffer circuit (P-Gamma Circuit) according to the exemplary embodiment of the present invention includes a digital signal receiver 300 and a digital-to-analog converter 200 of FIG. 2.

The digital signal receiver 300 receives a digital signal (can be set inside IC chip) and provides the received digital signal to the digital-to-analog converter 200. The digital-to-analog converter 200 receives the digital signal provided by the digital signal receiver 300 and converts the received digital signal into a corresponding analog voltage (or referred to as gamma correction voltage).

Figure 4:
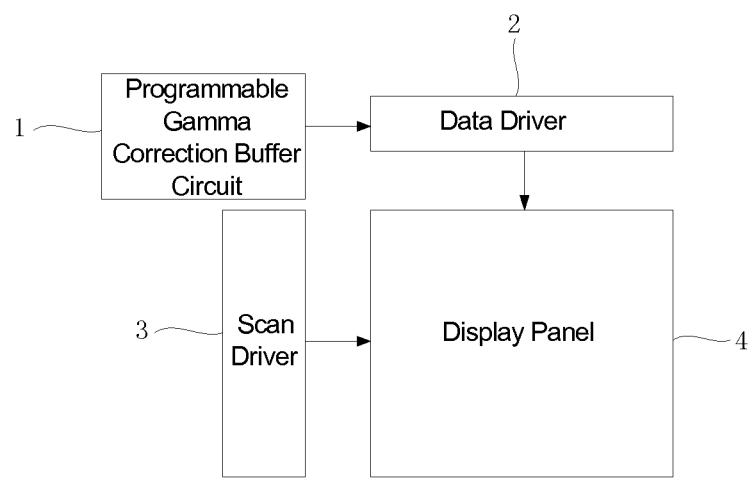
FIG. 4 is a schematic structural view of a display apparatus according to an exemplary embodiment of the present invention.

FIG. 4 is a schematic structural view of a display apparatus according to an exemplary embodiment of the present invention.

Referring to FIG. 4, the display apparatus according to the exemplary embodiment of the present invention includes: a programmable gamma correction buffer circuit 1, a data driver 2, a scan driver 3 and a display panel 4.

The programmable gamma correction buffer circuit 1 is for example the programmable gamma correction buffer circuit of FIG. 3 and converts inputted digital signal into a corresponding analog voltage (or referred to as gamma correction voltage). The data driver 2 is configured (i.e., structured and arranged) for generating a driving voltage desired by the display panel 4 according to the analog voltage provided by the programmable gamma correction buffer circuit 1. The scan driver 3 is configured for sequentially generating scanning signals. The display panel 4 is configured for displaying an image in response to the driving voltage provided by the data driver 2 and the scanning signals proved by the scan driver 3. The display panel 4 may be a liquid crystal display panel or an organic light emitting diode (OLED) display panel.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A digital-to-analog converter for outputting a first output analog voltage according to a N-bit first digital signal or outputting a second output analog voltage according to a N-bit second digital signal, the digital-to-analog converter comprising:

a first voltage generator, coupled between a first reference voltage and a second reference voltage and configured for generating $2^N$ first analog voltage between the first reference voltage and the second reference voltage;

a first voltage selector, coupled to the first voltage generator and configured for selecting the first output analog voltage from the $2^N$ first analog voltages generated by the first voltage generator according to the N-bit first digital signal;

a second voltage generator, coupled between the second reference voltage and a third reference voltage and configured for generating $2^N$ second analog voltage between the second reference voltage and the third reference voltage;

a second voltage selector, coupled to the second voltage generator and configured for selecting the second output analog voltage from the $2^N$ second analog voltages generated by the second voltage generator according to the N-bit second digital signal;

wherein the first voltage generator comprises $(2^N-1)$ first resistors and at least one second resistor connected in series between the first reference voltage and the second reference voltage, the second voltage generator comprises $(2^N-1)$ third resistors and at least one fourth resistor connected in series between the second reference voltage and the third reference voltage, such that the $(2^N-1)$ first resistors, the at least one second resistor, the $(2^N-1)$ third resistors and the at least one fourth resistor connected in series between the first reference voltage and the third reference voltage to cooperatively form a resistor string.

2. The digital-to-analog converter as claimed in claim 1, wherein the digital-to-analog converter further comprises:

a first voltage follower, configured for outputting the first output analog voltage selected by the first voltage selector according to the N-bit first digital signal.

3. The digital-to-analog converter as claimed in claim 1, wherein a resistance of the at least one resistor is a half of that of each of the $(2^N-1)$ first resistors.

4. The digital-to-analog converter as claimed in claim 1, wherein the first voltage selector comprises $2^N$ first select lines, each of the first select lines is correspondingly coupled to the first voltage generator to thereby provide the first output analog voltage corresponding to the first select line, each of the first select lines comprises N first switching elements connected in series, each of the first switching elements is controlled to be ON or OFF state by one bit of the N-bit first digital signal.

5. The digital-to-analog converter as claimed in claim 1, wherein the digital-to-analog converter further comprises:

a second voltage follower, configured for outputting the second output analog voltage selected by the second voltage selector according to the N-bit second digital signal.

6. The digital-to-analog converter as claimed in claim 1, wherein a resistance of the at least one fourth resistor is different from that of each of the $(2^N-1)$ third resistors.

7. The digital-to-analog converter as claimed in claim 1, wherein the second voltage selector comprises 2N second select lines, each of the second select lines is correspondingly coupled to the second voltage generator to thereby provide the second output analog voltage corresponding to the second select line, each of the second select lines comprises N second switching elements connected in series, and each of the second switching elements is controlled to be ON or OFF state by one bit of the N-bit second digital signal.

8. A programmable gamma correction buffer circuit comprising: a digital signal receiver and a digital-to-analog converter;

the digital signal receiver, configured for receiving a N-bit first digital signal or a N-bit second digital signal and providing the received N-bit first digital signal or N-bit second digital signal to a digital-to-analog converter;

the digital-to-analog converter, configured for outputting a first output analog voltage according to the N-bit first digital signal provided by the digital signal receiver or outputting a second output analog voltage according to the N-bit second digital signal provided by the digital signal receiver;

wherein the digital-to-analog converter comprises:

a first voltage generator, coupled between a first reference voltage and a second reference voltage and configured for generating $2^N$ first analog voltage between the first reference voltage and the second reference voltage;

a first voltage selector, coupled to the first voltage generator and configured for selecting the first output analog voltage from the $2^N$ first analog voltages generated by the first voltage generator according to the N-bit first digital signal;

a second voltage generator, coupled between the second reference voltage and a third reference voltage and configured for generating $2^N$ second analog voltage between the second reference voltage and the third reference voltage;

a second voltage selector, coupled to the second voltage generator and configured for selecting the second output analog voltage from the $2^N$ second analog voltages generated by the second voltage generator according to the N-bit second digital signal;

the first voltage generator comprises $(2^N-1)$ first resistors and at least one second resistor connected in series between the first reference voltage and the second reference voltage, the second voltage generator comprises $(2^N-1)$ third resistors and at least one fourth resistor connected in series between the second reference voltage and the third reference voltage, such that the $(2^N-1)$ first resistors, the at least one second resistor, the $(2^N-1)$ third resistors and the at least one fourth resistor connected in series between the first reference voltage and the third reference voltage to cooperatively form a resistor string.

9. The programmable gamma correction buffer circuit as claimed in claim 8, wherein the digital-to-analog converter further comprises:

a first voltage follower, configured for outputting the first output analog voltage selected by the first voltage selector according to the N-bit first digital signal.

10. The programmable gamma correction buffer circuit as claimed in claim 8, wherein a resistance of the at least one resistor is a half of that of each of the $(2^N-1)$ first resistors.

11. The programmable gamma correction buffer circuit as claimed in claim 8, wherein the first voltage selector comprises $2^N$ first select lines, each of the first select lines is correspondingly coupled to the first voltage generator to thereby provide the first output analog voltage corresponding to the first select line, each of the first select lines comprises N first switching elements connected in series, each of the first switching elements is controlled to be ON or OFF state by one bit of the N-bit first digital signal.

12. The programmable gamma correction buffer circuit as claimed in claim 8, wherein the digital-to-analog converter further comprises:

a second voltage follower, configured for outputting the second output analog voltage selected by the second voltage selector according to the N-bit second digital signal.

13. The programmable gamma correction buffer circuit as claimed in claim 8, wherein a resistance of the at least one fourth resistor is different from that of each of the $(2^N-1)$ third resistors.

14. The programmable gamma correction buffer circuit as claimed in claim 8, wherein the second voltage selector comprises $2^N$ second select lines, each of the second select lines is correspondingly coupled to the second voltage generator to thereby provide the second output analog voltage corresponding to the second select line, each of the second select lines comprises N second switching elements connected in series, and each of the second switching elements is controlled to be ON or OFF state by one bit of the N-bit second digital signal.

15. A display apparatus comprising:

a programmable gamma correction buffer circuit, configured for converting inputted a N-bit first digital signal or a N-bit second digital signal respectively into a first output analog voltage or a second output analog voltage;

a data driver, configured for generating a driving voltage desired by a display panel according to the first output analog voltage or the second output analog voltage provided by the programmable gamma correction buffer circuit;

a scan driver, configured for sequentially generating scanning signals;

the display panel, configured for displaying an image in response to the driving voltage provided by the data driver and the scanning signals provided by the scan driver;

wherein the programmable gamma correction buffer circuit comprises: a digital signal receiver and a digital-to-analog converter;

the digital signal receiver, configured for receiving the N-bit first digital signal or the N-bit second digital signal and providing the received N-bit first digital signal or N-bit second digital signal to a digital-to-analog converter;

the digital-to-analog converter, configured for outputting the first output analog voltage according to the N-bit first digital signal provided by the digital signal receiver or outputting the second output analog voltage according to the N-bit second digital signal provided by the digital signal receiver;

wherein the digital-to-analog converter comprises:

a first voltage generator, coupled between a first reference voltage and a second reference voltage and configured for generating $2^N$ first analog voltage between the first reference voltage and the second reference voltage;

a first voltage selector, coupled to the first voltage generator and configured for selecting the first output analog voltage from the $2^N$ first analog voltages generated by the first voltage generator according to the N-bit first digital signal;

a second voltage generator, coupled between the second reference voltage and a third reference voltage and configured for generating $2^N$ second analog voltages between the second reference voltage and the third reference voltage;

a second voltage selector, coupled to the second voltage generator and configured for selecting the second output analog voltage from the $2^N$ second analog voltages generated by the second voltage generator according to the N-bit second digital signal the first voltage generator comprises $(2^N-1)$ first resistors and at least one second resistor connected in series between the first reference voltage and the second reference voltage, the second voltage generator comprises $(2^N-1)$ third resistors and at least one fourth resistor connected in series between the second reference voltage and the third reference voltage, such that the $(2^N-1)$ first resistors, the at least one second resistor, the $(2^N-1)$ third resistors and the at least one fourth resistor connected in series between the first reference voltage and the third reference voltage to cooperatively form a resistor string.

16. The display apparatus as claimed in claim 15, wherein the digital-to-analog converter further comprises:

a first voltage follower, configured for outputting the first output analog voltage selected by the first voltage selector according to the N-bit first digital signal;

a second voltage follower, configured for outputting the second output analog voltage selected by the second voltage selector according to the N-bit second digital signal.

17. The display apparatus as claimed in claim 15, wherein a resistance of the at least one resistor is a half of that of each of the $(2^N-1)$ first resistors.

18. The display apparatus as claimed in claim 15, wherein the first voltage selector comprises $2^N$ first select lines, each of the first select lines is correspondingly coupled to the first voltage generator to thereby provide the first output analog voltage corresponding to the first select line, each of the first select lines comprises N first switching elements connected in series, each of the first switching elements is controlled to be ON or OFF state by one bit of the N-bit first digital signal.

19. The display apparatus as claimed in claim 15, wherein a resistance of the at least one fourth resistor is different from that of each of the $(2^N-1)$ third resistors.

20. The display apparatus as claimed in claim 15, wherein the second voltage selector comprises 2N second select lines, each of the second select lines is correspondingly coupled to the second voltage generator to thereby provide the second output analog voltage corresponding to the second select line, each of the second select lines comprises N second switching elements connected in series, and each of the second switching elements is controlled to be ON or OFF state by one bit of the N-bit second digital signal.

* * * * *